United States Patent [19]

Miyata

[11] Patent Number: 5,850,252
[45] Date of Patent: Dec. 15, 1998

[54] CAMERA ADJUSTING DEVICE OF AN APPARATUS FOR MOUNTING AN ELECTRONIC EQUIPMENT ON A PRINTED CIRCUIT BOARD

[75] Inventor: Yasuhisa Miyata, Saitama-ken, Japan

[73] Assignee: Pioneer Electronic Corporation, Tokyo, Japan

[21] Appl. No.: 598,630

[22] Filed: Feb. 12, 1996

Related U.S. Application Data

[63] Continuation of Ser. No. 373,429, Jan. 17, 1995, abandoned.

[30] Foreign Application Priority Data

Jan. 19, 1994 [JP] Japan .................................. 6-003889

[51] Int. Cl.$^6$ ...................................................... H04N 7/18
[52] U.S. Cl. .............................. 348/87; 348/88; 348/91; 348/92
[58] Field of Search ................................. 348/87, 88, 91, 348/92, 125, 126, 130

[56] References Cited

U.S. PATENT DOCUMENTS

| | | | |
|---|---|---|---|
| 4,899,921 | 2/1990 | Bendat et al. ............................ | 348/87 |
| 5,161,202 | 11/1992 | Kitakado et al. ......................... | 348/87 |
| 5,204,739 | 4/1993 | Domenicali .............................. | 348/87 |
| 5,235,407 | 8/1993 | Spigarelli et al. ........................ | 348/87 |
| 5,311,304 | 5/1994 | Monno .................................... | 348/87 |
| 5,396,279 | 3/1995 | Vossen .................................... | 348/87 |
| 5,457,538 | 10/1995 | Ujiie ......................................... | 348/87 |
| 5,461,417 | 10/1995 | White et al. .............................. | 348/87 |

*Primary Examiner*—Tommy P. Chin
*Assistant Examiner*—Anand Rao
*Attorney, Agent, or Firm*—Nikaido, Marmelstein, Murray & Oram LLP

[57] ABSTRACT

A pair of cameras are mounted on a base member for monitoring an electronic equipment on a printed circuit board. A pair of first mirrors are provided for reflecting light from the electronic equipment in a first reflection direction which corresponds to an X-axis on the electronic equipment, and a pair of second mirrors are mounted for reflecting the light reflected on the first mirrors in a second reflection direction which is different from the first reflection direction and corresponds to a Y-axis. The base member is moved in two directions corresponding to the X- and Y-axis.

5 Claims, 17 Drawing Sheets

CAMERA ADJUSTING DEVICE OF AN APPARATUS FOR MOUNTING AN ELECTRONIC EQUIPMENT ON A PRINTED CIRCUIT BOARD

This application is a continuation of application Ser. No. 08/373,429, filed on Jan. 17, 1995, now abandoned.

BACKGROUND OF THE INVENTION

The present invention relates to a device for adjusting the positions of cameras which are provided in an electronic equipment mounting apparatus.

There has been developed a mounting apparatus for mounting an electronic equipment such as an IC on a printed circuit board (PCB). The mounting apparatus is provided with cameras for monitoring the PCB so that a circuit pattern on the PCB and leads of the electronic equipment are accurately registered.

Referring to FIG. 12, a conventional mounting apparatus comprises a base 10 wherein a control system for controlling the mounting apparatus is disposed, a mounting device 30 provided on the base 10 for mounting electronic equipments on a PCB, and a control panel 20 which is operated when carrying out various operations.

The mounting device 30 has an X-Y table 11 on which a substrate holder 32 is mounted for adhering the PCB substrate. A suction head 33 for carrying an electronic equipment such as a tape automated bonding (herein after called TAB) is disposed above the suction holder 32. To one side of the X-Y table 11 is disposed a TAB blanking unit 35 wherein TABs are blanked from a piece of conductive film. The suction head 33 picks up the TAB by suction and places it on the suction holder 32. Four CCD cameras 34 are positioned around the suction head 33 to overlook the holder 32. Pictures taken by the cameras 34 are shown on a multiscan monitor 40 which is mounted on the mounting device 30 at a position above the TAB blanking unit 35.

Referring to FIG. 13 describing the operation for mounting a TAB on a PCB, an operator manually sets a TAB positioned on a carrier on a die of the blanking unit 35 at a step 201 and operates a start switch on the control panel 20 at a step 202. A punch of the blanking unit 35 is lowered at a step 203, thereby blanking a TAB. At the same time, leads are formed on the TAB, the process of which is called forming. The die together with the TAB is then moved to a position directly under the suction head 33 at a step 204. The suction head 33 is lowered, thereby picking up the TAB by sucking while the die returns to its initial position in the blanking unit 35 at steps 205 and 206. Thereafter, the suction head 33 places the TAB on a PCB on the X-Y table and a reflow soldering is performed, thereby mounting the TAB on the PCB.

Referring to FIGS. 13 to 16, in order to mount a quad flat package (hereinafter called QFP) 21 as an electronic equipment on a PCB substrate 24. The QFP is disposed on a QFP tray 23. The tray 23 is set at a predetermined position of the X-Y table 11 adjacent the substrate holder 32 (step 301). The PCB substrate 24 which is applied with flux is set on the substrate holder 32 at a step 302. When a start switch is turned on at a step 303, the X-Y table 11 is moved so that a first point of the QFP tray is positioned in a moving range of the suction head 33 at a step 304. The suction head 33 is then lowered to pick up the QFP on the tray 23 by suction and puts it on a positioning station 23a as shown by a dot-dash line in FIG. 15.

At step 305, the operator watches the multiscan monitor 40 and moved the X and Y cursors on the monitor 40 to coincide them with an image of an end of a lead 22 of the QFP, thereby making a fine adjustment. The start switch is operated at a step 306, so that the suction head 33 is lowered at a step 307, sucking the QFP 22 on the tray 23. The start switch is again operated at a step 308 so that the X-Y table 11 is moved at a step 309, thereby positioning a soldering point of the PCB 24 comes directly under the suction head 33. At a step 310, the head 33 is lowered to a height appropriate for adjusting the positions of the head 33 and the X-Y table at a step 311. Namely, the operator watches the monitor 40 and adjusts the head 33 and the X-Y table so that the leads 22 of the QFP 21 are directly above the solder as shown in FIG. 16.

Thereafter, the start switch is operated at a step 312, thereby further lowering the suction head 33. As a result, the QFP lands on the PCB 24, the ends of the leads 22 thereof resting on the solder. The heat is applied to the solder, thereby reflow soldering the QFP at a step 313. The X-Y table 11 on which the PCB 24 with the QFP 21 returns to the initial position and the PCB 24 is retrieved (steps 314 and 315).

Referring to FIG. 17, the cameras 34 for monitoring the PCB 24 and the QFP 21 must be small so as not to interfere with the movements of the suction head 33. Moreover, the cameras 34 must be inclined with respect to the surface of the PCB 24 in order to take pictures of the leads 22. Thus when adjusting the QFP 21 and the X-Y table, four cameras are necessary to monitor the four sides of the QFP 21.

In order to decrease the number of the cameras, there has been proposed a use of mirrors. Referring to FIG. 18, a pair of mirrors 25a are provided at positions corresponding to the diagonal corners of the PCB so that each overlooks the adjacent two sides of the QFP. The picture reflected on each mirror 25a is further reflected on corresponding opposite mirror 25b and transmitted to the camera 34. Hence only two cameras are needed. However, the position of each camera 34 must be adjusted independently from the other camera in accordance with the size of the QFP, the operation of which is complicated.

SUMMARY OF THE INVENTION

An object of the present invention is to provide an adjusting device for cameras wherein the positions of the cameras are easily adjusted to obtain an appropriate view area for monitoring a PCB and an electronic equipment which is to be mounted on the PCB.

According to the present invention, there is provided a camera adjusting device for an electronic equipment on a printed circuit board, comprising a pair of cameras mounted on a base member, a pair of first mirrors for reflecting light from the electronic equipment in a first reflection direction which corresponds to a first axis on the electronic equipment, a pair of second mirrors for reflecting the light reflected on the first mirrors in a second reflection direction which is different from the first reflection direction and corresponds to a second axis perpendicular to the first axis. The base member is moved in two directions corresponding to the first and second axis so that the movement of the cameras coincides with the first and second axis.

The first reflection direction is a first horizontal direction corresponding to the first axis, and the second reflection is a second horizontal direction which is perpendicular to the first horizontal direction and corresponds to the second axis.

The other objects and features of this invention will become understood from the following description with reference to the accompanying drawings.

BRIEF DESCRIPTION OF DRAWINGS

FIG. 8a is an elevational view schematically showing the mirrors and the cameras of FIG. 7 for describing the operation thereof;

FIG. 8b is a plan view showing the mirrors and cameras of FIG. 8a;

DETAILED DESCRIPTION OF THE PREFERRED EMBODIMENT

Figure 1:
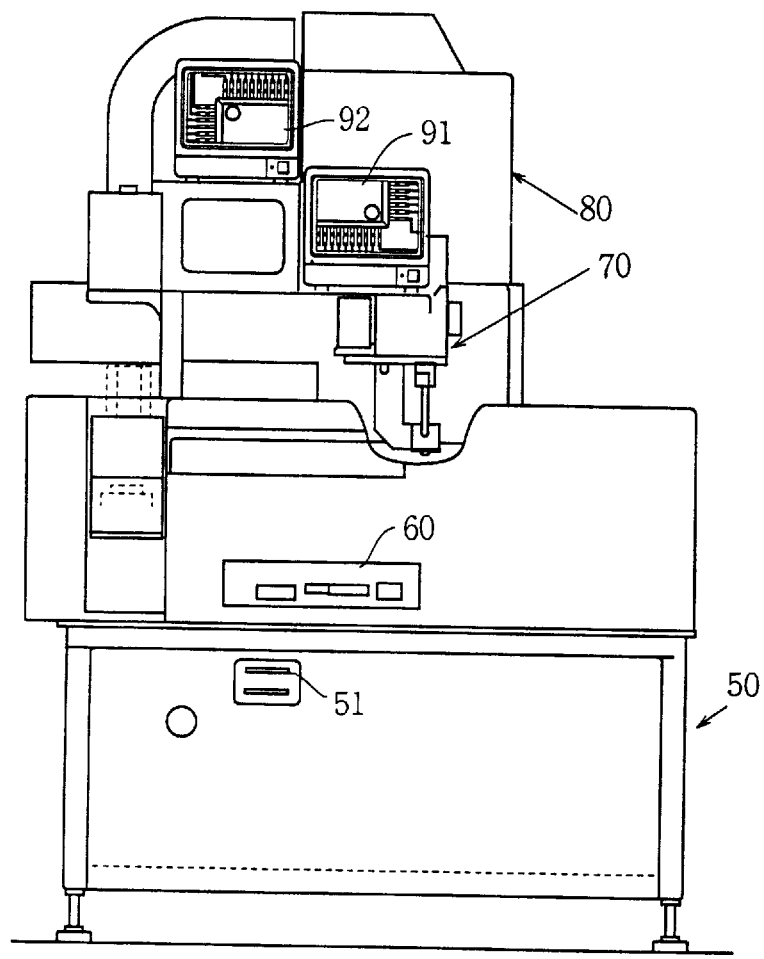
FIG. 1 is an elevational view of a mounting apparatus to which the present invention is applied.

Referring to FIG. 1, an apparatus for mounting an electronic equipment such as a QFP and a TAB on a PCB comprises a base 50 housing a control system, a table mounted on a base and having a control panel 60 for operating the apparatus, a mounting device 70 which mounts the electronic equipment on the PCB placed on the table, and a radiation head 80 which emits a light beam for heating a solder so as to reflow solder the electronic equipment after the mounting. The base 50 has a floppy disc driver 51 so that the apparatus is operated in accordance with a program stored in a floppy disc. A pair of monitors 91 and 92 are provided to display pictures taken by a pair of cameras 67A and 67B (FIG. 3) which monitor the electronic equipment. The monitors 91 and 92 are disposed in accordance with the viewing areas of the cameras 67A and 67B.

Figure 2:
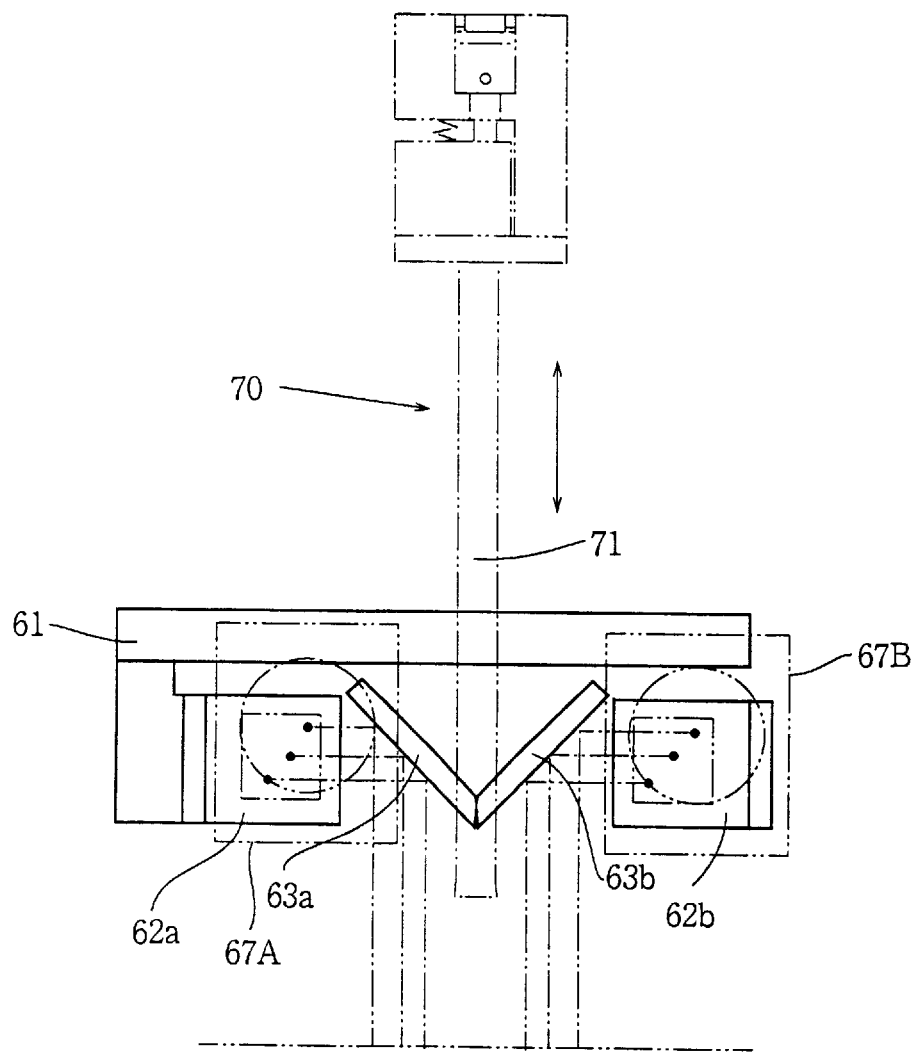
FIG. 2 is an illustration showing a part of the mounting apparatus of FIG. 1 as seen from the front.

Referring to FIG. 2, describing the apparatus as viewed from the front, the mounting device 70 has a vertically extending suction nozzle 71 which picks up the electronic equipment and puts it on the PCB. A horizontal base panel 61 is fixed to the nozzle 71. A pair of first mirrors 63a and 63b which are attached to each other at the right angle are fixed to the base panel 61 through a means (not shown). Each of the first mirrors 63a and 63b is inclined in the direction opposite the other so as to confront the table on which the PCB is to be set.

Figure 7:
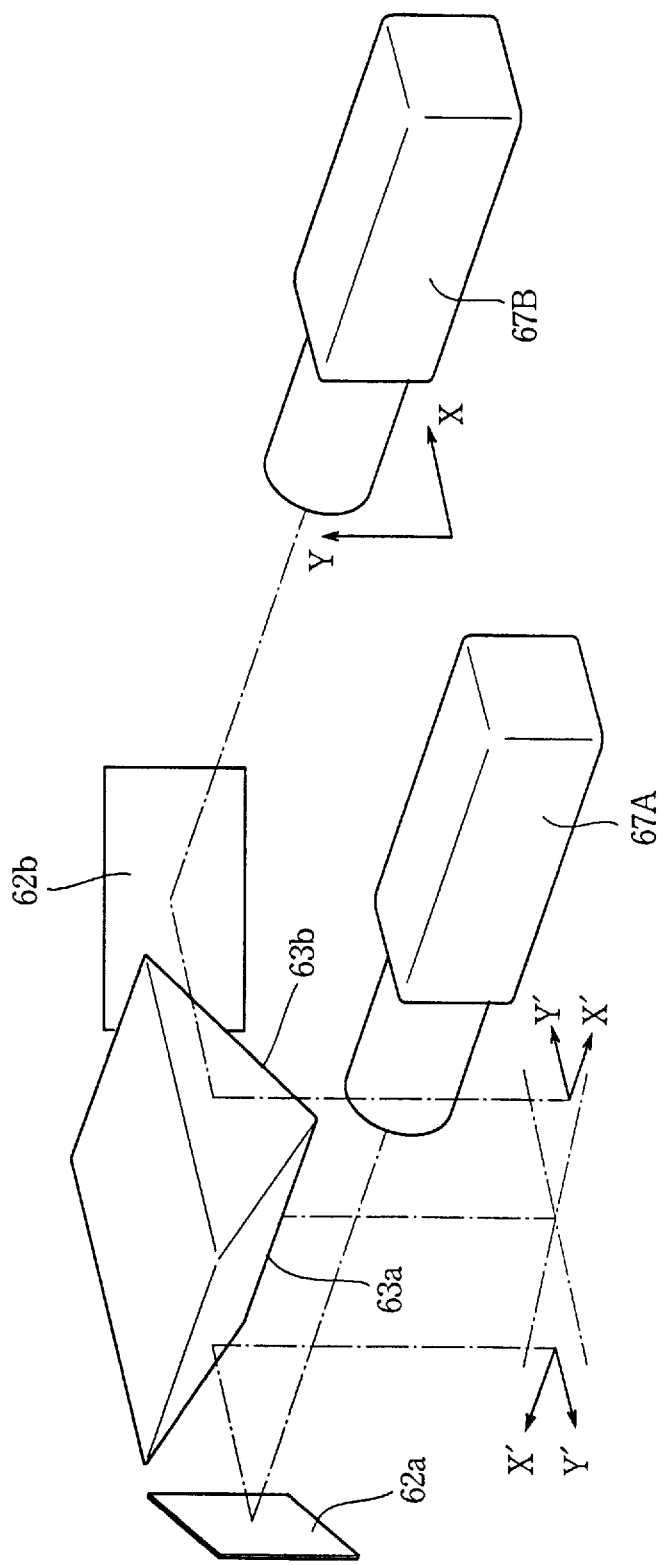
FIG. 7 is a perspective view schematically showing mirror and cameras provided in the mounting apparatus of the present invention.
Figure 8:
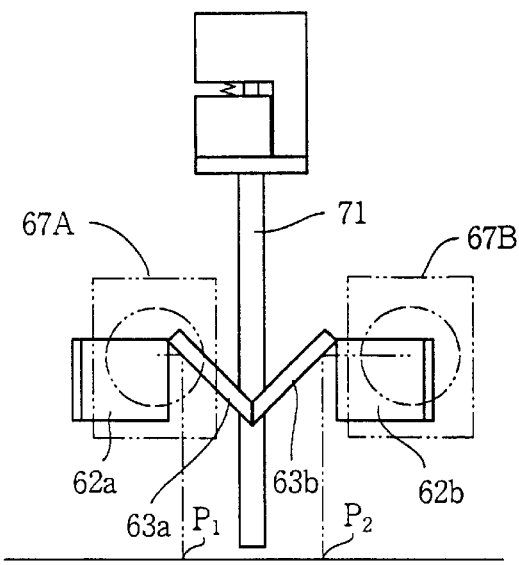
Figure 8:
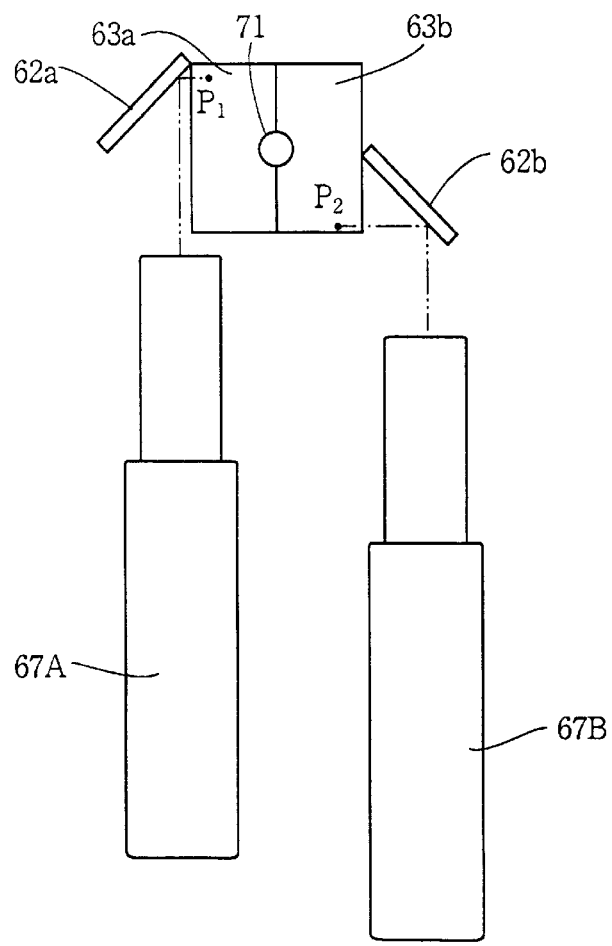
Figure 9:
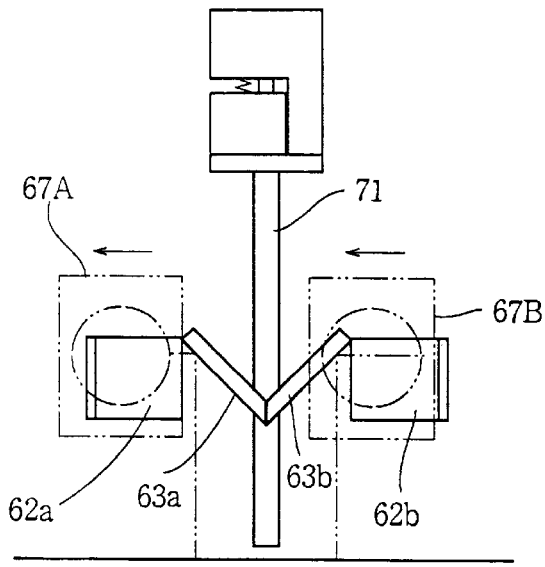
FIGS. 9a and 9b are diagrams similar to FIGS. 8a and 8b, explaining the adjustment of the cameras.
Figure 9:
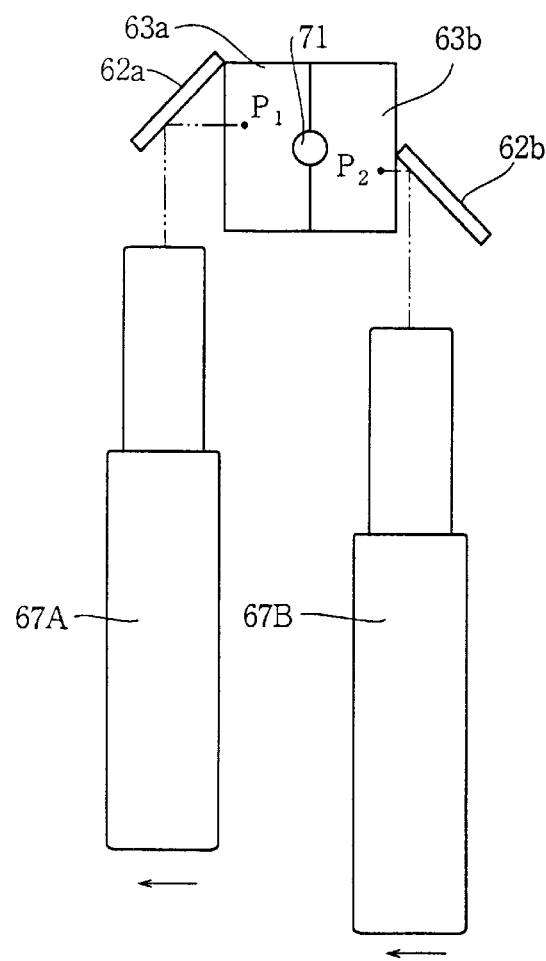
Figure 10:
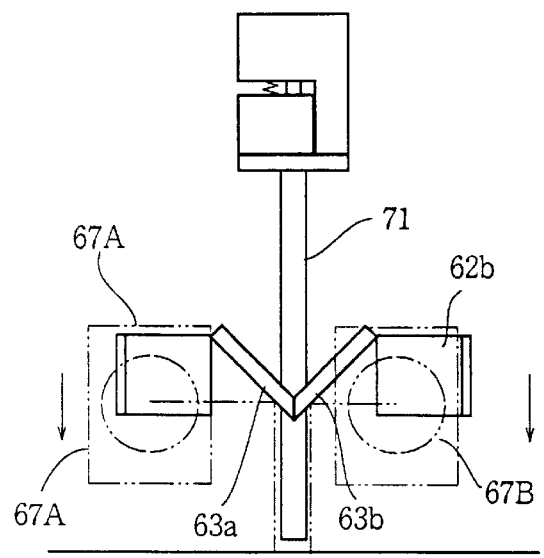
FIGS. 10a and 10b are diagrams similar to FIGS. 8a and 8b, explaining the adjustment of the cameras.
Figure 10:
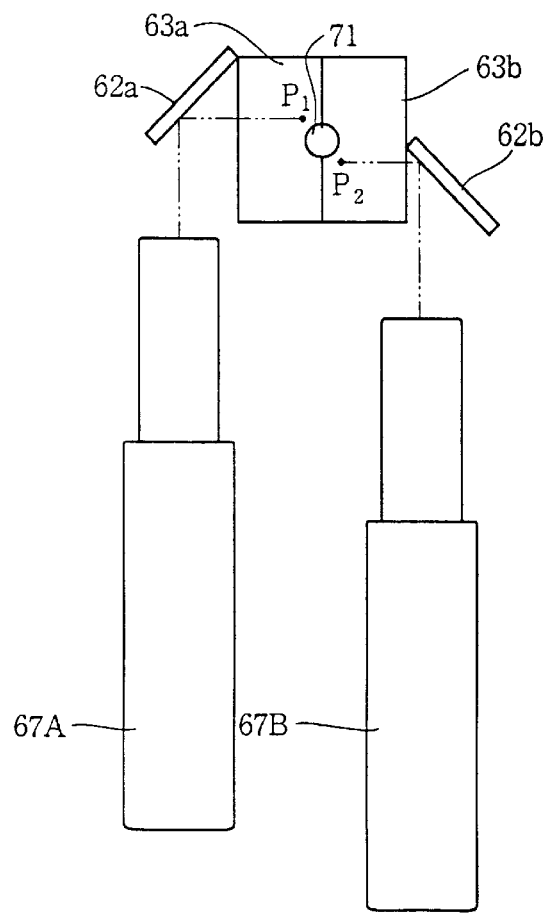
Figure 11:
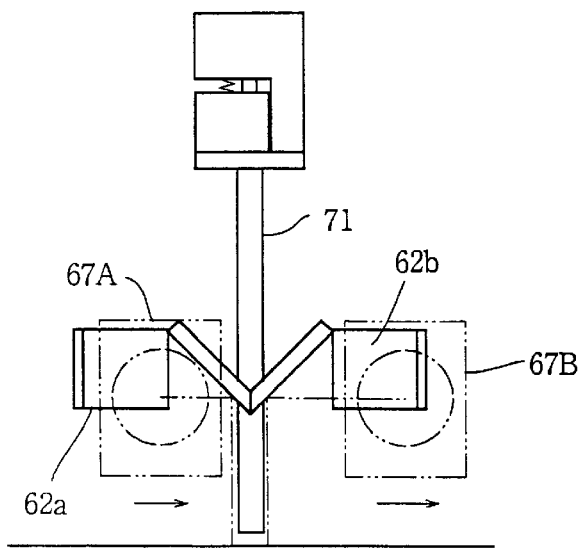
FIGS. 11a and 11b are diagrams similar to FIGS. 8a and 8b, explaining the adjustment of the cameras.
Figure 11:
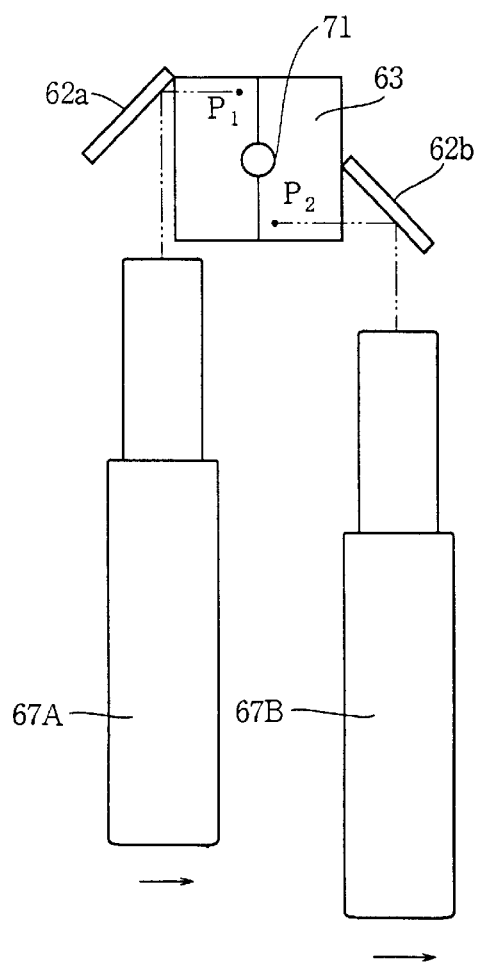

A pair of second mirrors 62a and 62b are further attached to the lower surface of the base panel 61, facing the mirrors 63a and 63b, respectively. The cameras 67A and 67B are disposed opposing the second mirrors 62a and 62b, respectively as shown in FIG. 7. Hence the pictures of the PCB on the table reflected on the first mirrors 63a and 63b, are further reflected on the second mirrors 62a and 62b and applied to the cameras 67A and 67B.

Figure 3:
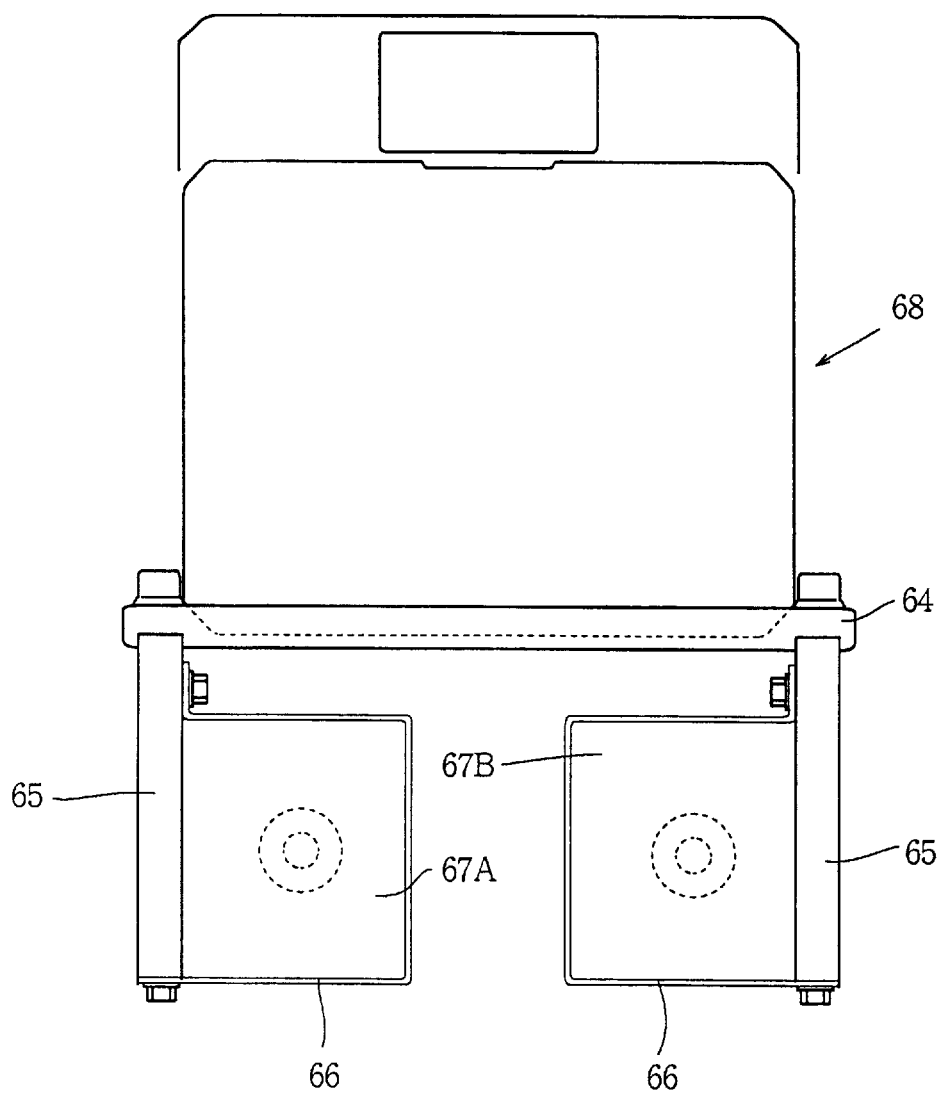
FIG. 3 is an illustration showing another part of the mounting apparatus as further seen from the front.

As shown in FIG. 3, a horizontal base member 64 having a pair of downwardly extending camera supporting members 65 is disposed at the inner side of the mirrors. A camera holder 66 is attached to each supporting member 65 so that the cameras 67A and 67B are held in in the respective camera holders 66. A camera positioning device 68 is mounted on the base 64 for adjusting the position of the cameras.

Figure 4:
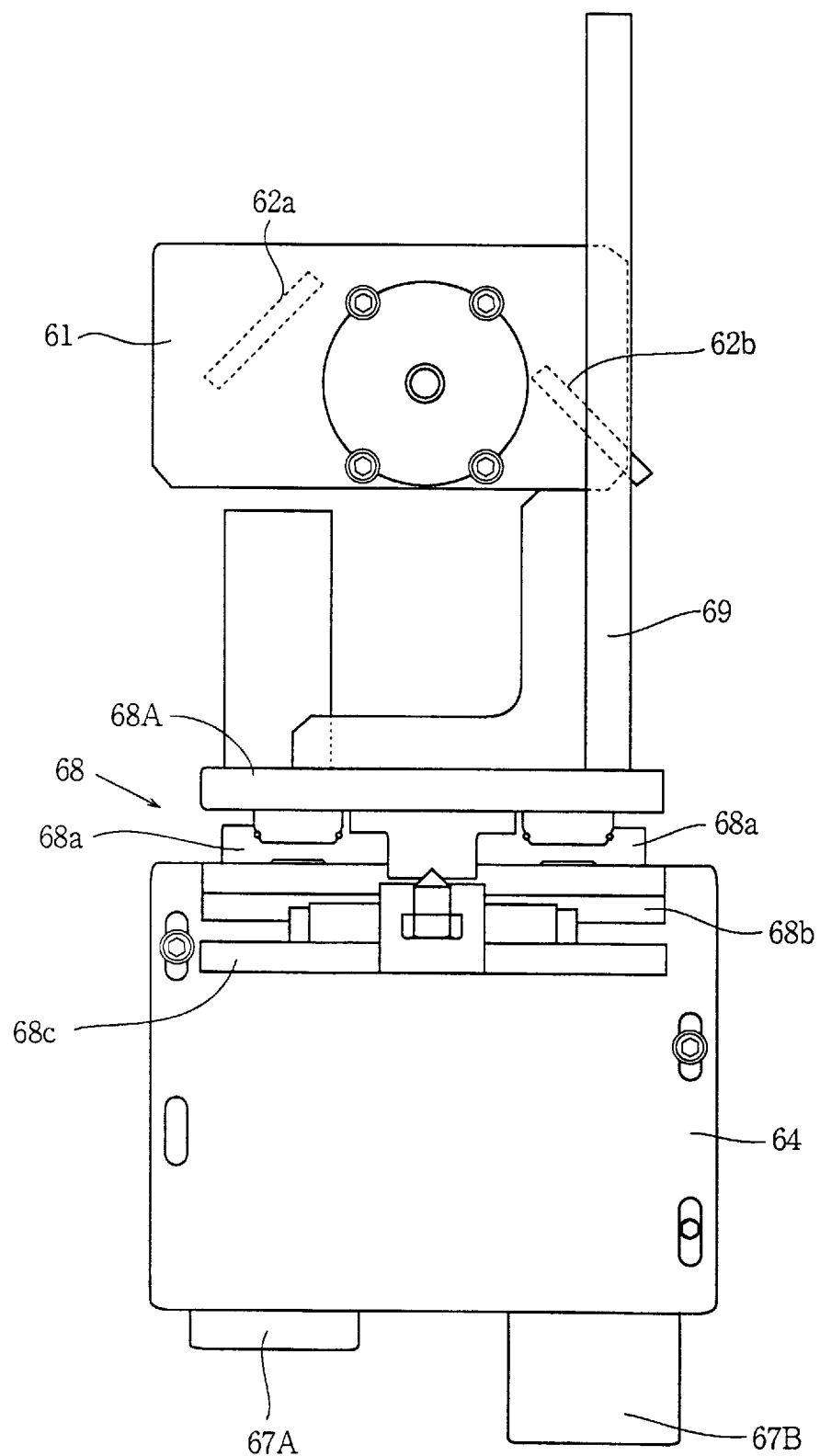
FIG. 4 is a plan view of a part of the mounting apparatus.
Figure 5:
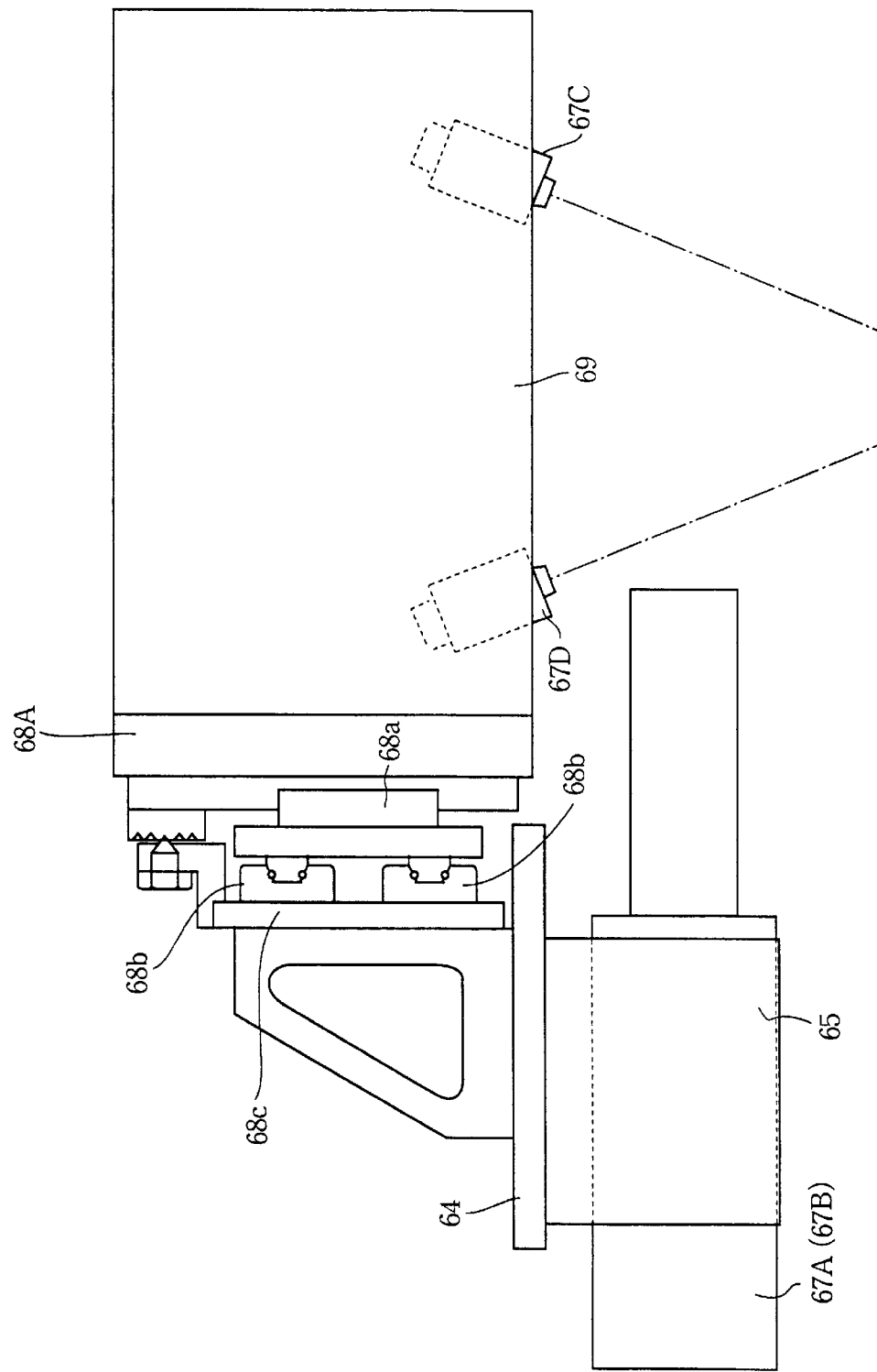
FIG. 5 is an elevational view of the mounting apparatus of FIG. 4.

Referring to FIGS. 4 and 5, the camera positioning device 68 comprises a vertical base panel 68A, on one side of which is attached a pair of vertically extending Y-axis rails 68a. A pair of horizontal upper and lower X-axis rails 68b are slidably mounted on the Y-axis rails 68b. Attached to the X-axis rails 68b is a carrier base 68c which is attached to the base member 64 through a bracket. Thus, when the X-axis rails 68b slide on the Y axis rails 68a, the cameras 67A and 67B on the base member 64 are either elevated or lowered, that is carried in the Y-axis direction. When the carrier base 68c slides on the X-axis rails 68b, the cameras 67A and 67B move in the lateral direction of the apparatus, that is the X-axis direction. The cameras are mounted on the same base member 64 so that the movements thereof are synchronous. The base panel 68A further supports a longitudinally extending supporting plate 69 on which are attached a pair of lights 67C and 67D for illuminating the electronic equipment to be mounted on a PCB.

Figure 6:
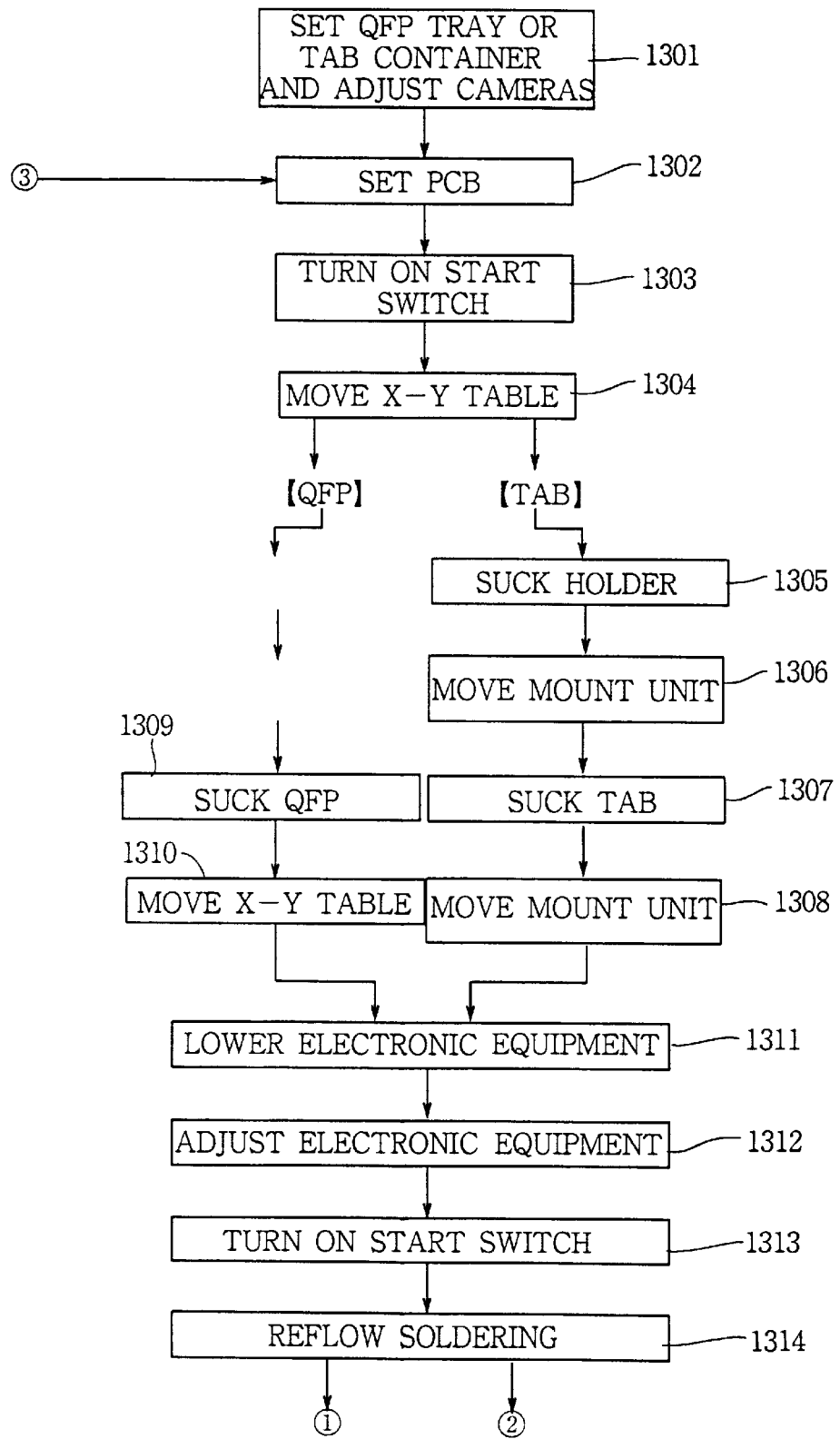
FIGS. 6a and 6b show a flowchart describing the operation of the mounting apparatus.
Figure 6:
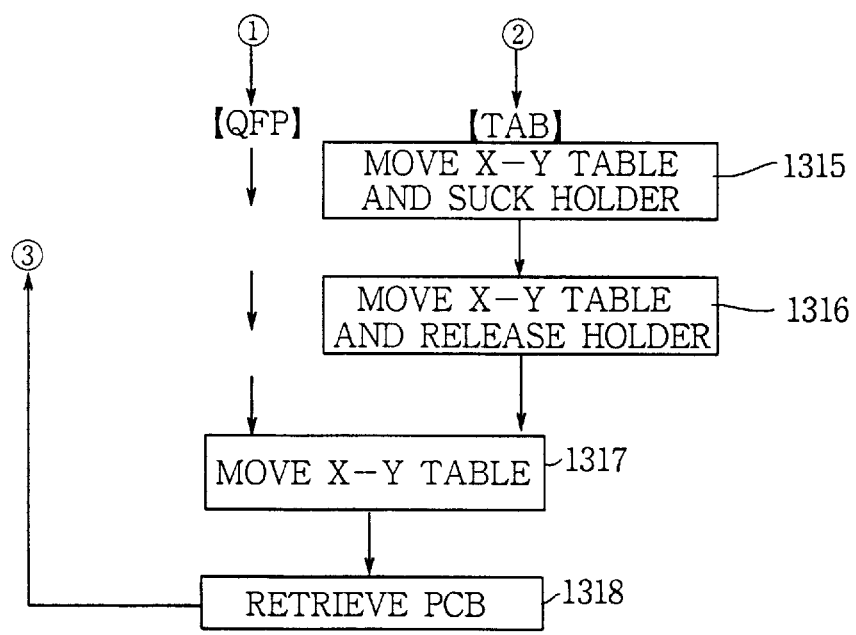
Figure 12:
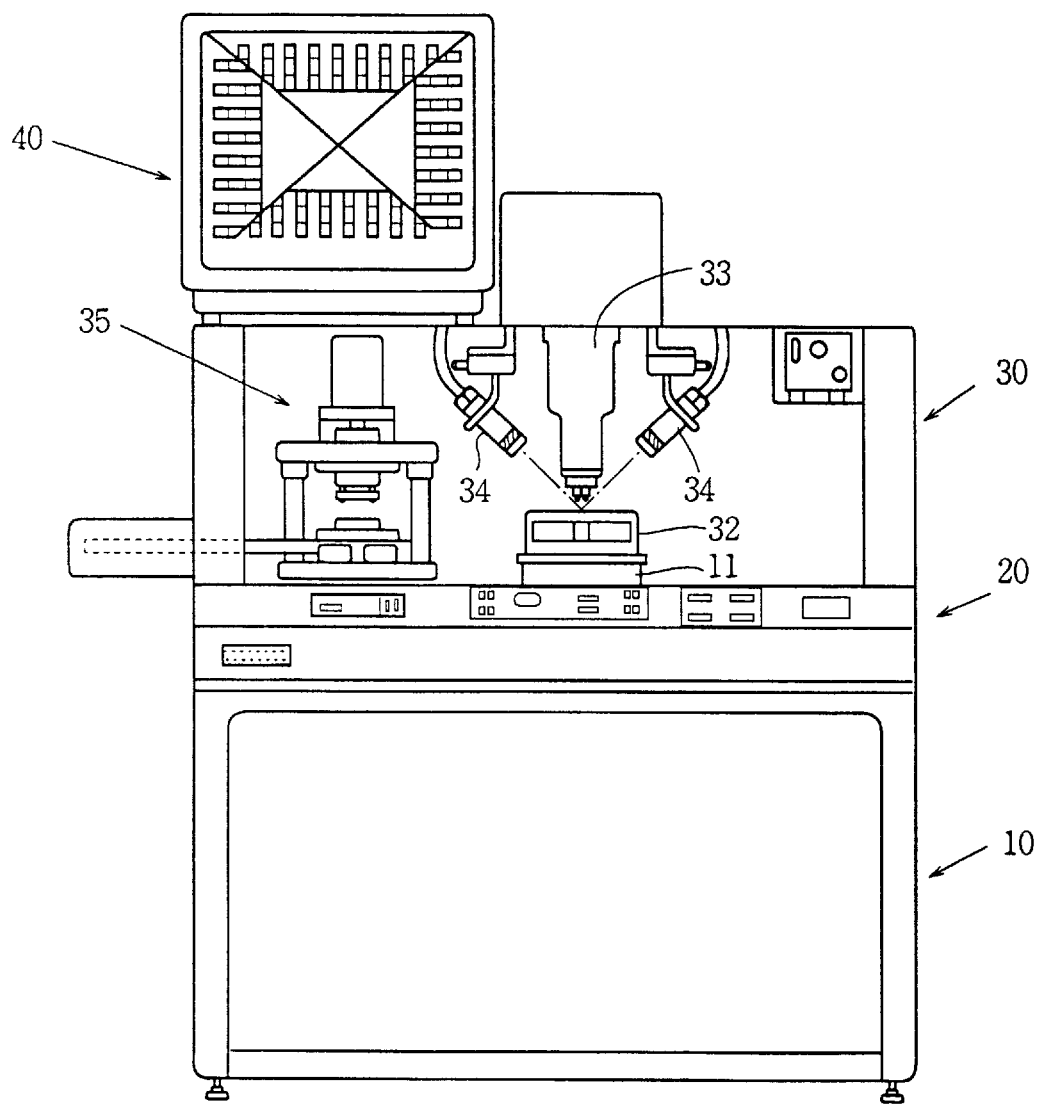
FIG. 12 is an elevational view of a conventional mounting apparatus.
Figure 13:
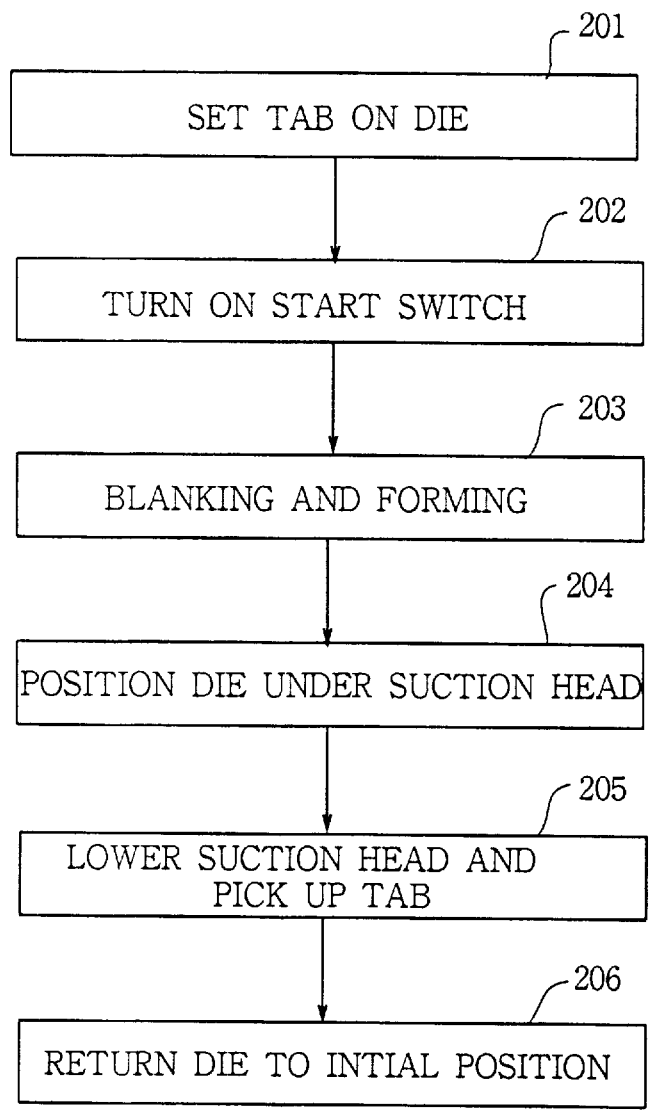
FIG. 13 is a flowchart describing the operation of the conventional mounting apparatus when mounting a tape automated bonding on a PCB.
Figure 14:
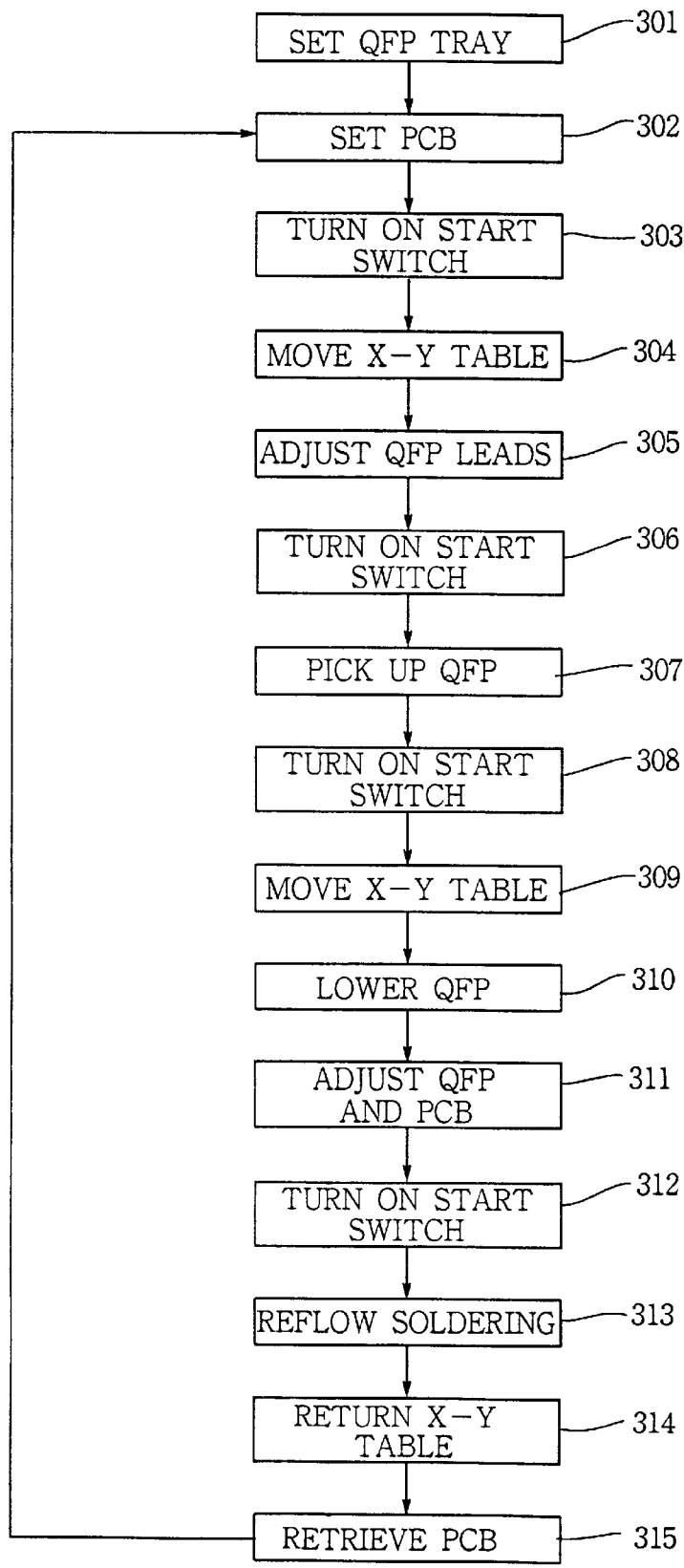
FIG. 14 is a flowchart describing the operation of the conventional mounting apparatus when mounting a quad flat package on a PCB.
Figure 15:
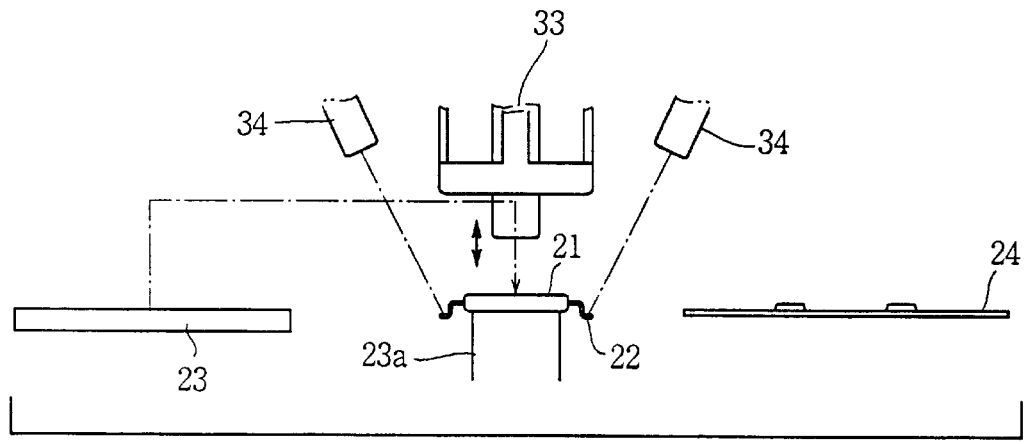
FIG. 15 is an illustration showing a mounting of the quad flat package.
Figure 16:
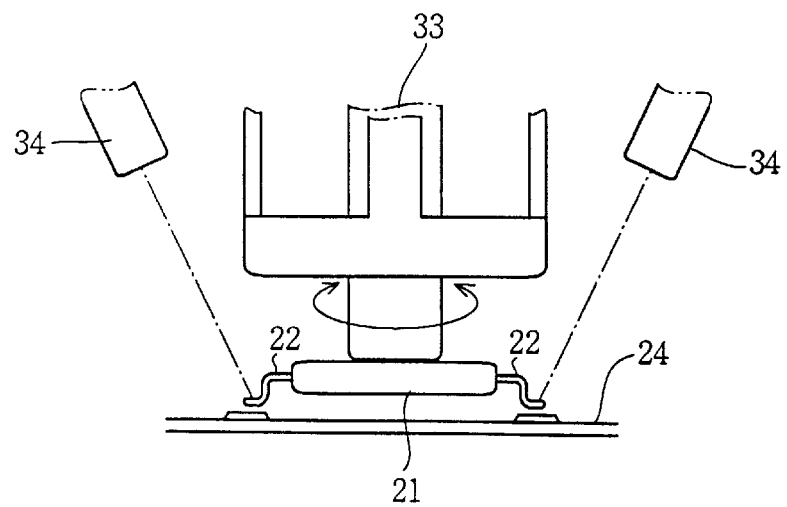
FIG. 16 is an illustration explaining a view field of cameras provided in the mounting apparatus.
Figure 17:
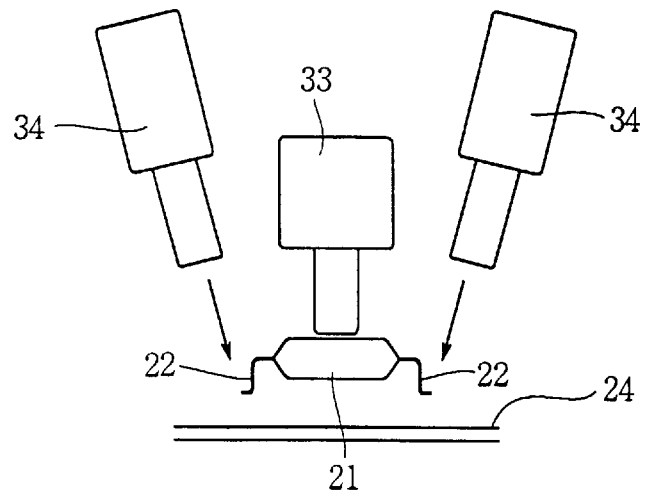
FIG. 17 is an illustration explaining the position of the cameras provided in the mounting apparatus.
Figure 18:
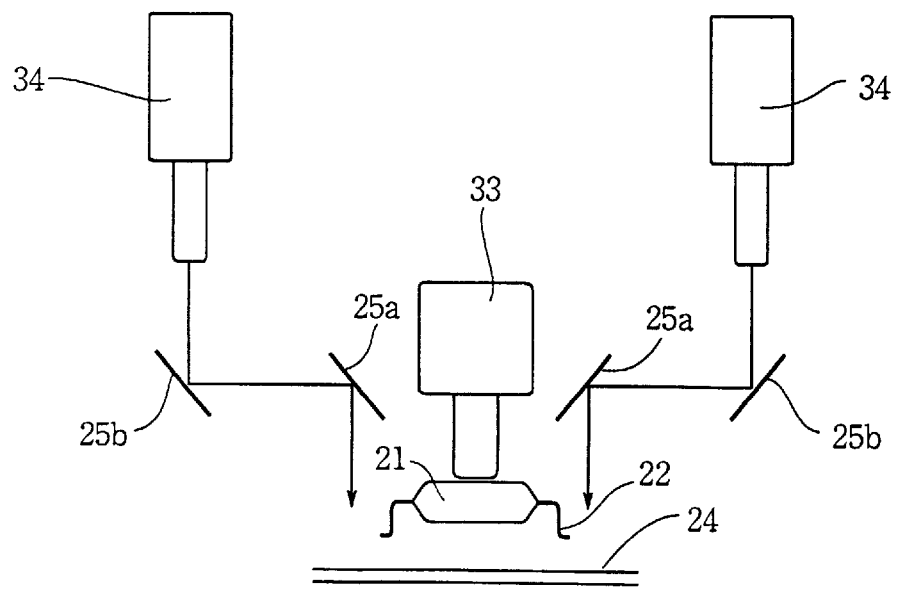
FIG. 18 is an illustration showing another example of the mounting apparatus where the positions of cameras are altered.

The operation of the mounting apparatus is now described with reference to FIGS. 6a and 6b. Before the operation, electronic devices such as the QFP and TAB are set on a tray or put in a container. At a step 1301, the tray or the container is set on an X-Y table which is similar to that described in FIG. 12. Furthermore, the suction nozzle 71 is lowered so that the monitors 91 and 92 show pictures taken by the CCD cameras 67A and 67B. The positions of the cameras 67A and 67B are adjusted in accordance with the size of the electronic devices so that two diagonal corners of an electronic equipment will be shown. The details of the operation will be later described. At a step 1302, the operator sets and clamps a PCB on the X-Y table at a step 1302. When the operator turns on a start switch at a step 1303, the X-Y table is moved so as to position the tray or the container position under the suction nozzle 71 at a step 1304.

In the case of mounting a QFP on the PCB, the nozzle 71 is lowered and picks up the QFP on the tray by suction at a step 1309. At a step 1310, the X-Y table is further moved so that a mounting point on a PCB comes under the nozzle 71.

Thereafter, the suction nozzle 71 is lower to a height at which the position of the QFP is adjusted. As the nozzle 71 is lowered at a step 1311, the second mirrors 62a and 62b mounted thereon are lowered, thereby enabling the monitors 91 and 92 to show the two diagonal corners of the QFP.

When the diagonal corners are not shown, the operator adjusts the positions of the cameras 67A and 67B. At a step 1312, the operator further adjusts the X-Y table in the X and Y directions and rotates the suction nozzle 71 in the axial direction while watching the pictures on the monitors 91 and 92 so as to coincide the positions of the leads of the QFP with the circuit pattern formed on the PCB at a step 1312.

When the start switch is turned on at a step 1313, the QFP is mounted on the PCB and the radiation head 80 is operated so that light beam is radiated on the leads of the QFP so that reflow soldering is performed at a step 1314. The lowering and raising of an IC pusher and cooling are successively carried out.

Thereafter, X-Y table is moved to a PCB retrieving position at a step 1317 so that the PCB is retrieved at a step 1318.

When mounting a TAB on a PCB, a blanking unit is provided in the mounting apparatus. As explained in the description of the conventional mounting apparatus, the produced TAB is mounted on a die of the blanking unit. The die is mounted on a movable mount unit. When the X-Y table is moved at the step 1304, the suction nozzle 71 is positioned over a TAB holder on the X-Y table which is picked up by suction at a step 1305. The mount unit of the blanking unit is moved so that the nozzle 71 is positioned above the die at a step 1306. At a step 1307 the nozzle 71 is lowered so as to attract the TAB by suction and thereafter, at a step 1308, the mount unit returns to its initial position. The program then executes the steps 1311 to 1314 thereby mounting and soldering the TAB on the PCB. Thereafter, at a step 1315, the X-Y table is moved to the position under the suction nozzle 71 so that the nozzle picks up the TAB holder on the TAB and carries it to its storing position at steps 315 and 316. Thereafter, the X-Y table is moved, thereby retrieving the PCB at the steps 1317 and 1318.

The adjustment of the cameras 67A and 67ab, which is carried out at steps 1301 and 1311 is described hereinafter with reference to FIGS. 7 to 11.

The cameras 67A and 67B are positioned with respect to the mirrors 62a, 62b, 63a and 63b as shown in FIG. 7 and are capable of simultaneously moving in X-axis and Y-axis directions by the camera positioning device 68.

Referring to FIGS. 8a and 8b, when the cameras 67A and 67B are at positions shown by dot-dash lines in FIG. 8a, points P1 and P2 on an electronic equipment are reflected on the first mirrors 63a and 63b and the second mirrors 62a and 62b as shown in FIG. 8b. When the cameras 67A and 67B are horizontally moved to the left in FIG. 9a, that is in the X-axis direction, the reflection points on the second mirrors 62a and 62b for the cameras 67A and 67B are moved in the X-axis direction, and the reflection points on the first mirrors 63a and 63b move in the X'-axis direction of FIG. 7.

When the cameras 67A and 67B are downwardly moved as shown in FIG. 10a, that is in the Y-axis direction, the reflection points of the second mirrors 62a and 62b are vertically moved, and the reflection points on the first mirrors 63a and 63b move in the Y'-axis direction of FIG. 7. When the cameras 67A and 67B are further moved laterally to the right in FIG. 11a, the points P1 and P2 are moved in the X'-axis direction.

The first mirrors are disposed at a predetermined angle with respect to the mounting surface of the electronic equipment, and the second mirrors are disposed at a predetermined angle with respect to the reflection of the first mirrors. Thus, the cameras 67A and 67B are able to detect the two diagonal corners of the electronic equipment. Accordingly, the viewing areas of the electronic equipment taken by the cameras 67A and 67A can be easily adjusted only by moving the camera in vertical and lateral directions.

From the foregoing it will be understood that the present invention provides a simple adjusting device for cameras wherein the adjustment is facilitated.

While the presently preferred embodiment of the present invention has been shown and described, it is to be understood that this disclosure is for the purpose of illustration and that various changes and modifications may be made without departing from the scope of the invention as set forth in the appended claims.

What is claimed is:

1. A camera adjusting device for an electronic equipment on a printed circuit board, comprising:

a pair of cameras mounted on a base member;

a pair of first mirrors securely provided for reflecting light from the electronic equipment in a first horizontal reflection direction which corresponds to a first axis on the electronic equipment;

a pair of second mirrors securely provided for reflecting the light reflected on the first mirrors in a second horizontal reflection direction which is perpendicular to the first reflection direction and corresponds to a second axis perpendicular to the first axis; and moving means for relatively moving the base member with respect to the first and second mirrors in a first horizontal direction corresponding to the first axis, and in a second horizontal direction which is perpendicular to the first horizontal direction and corresponds to the second axis so that resultant movement of the cameras coincides with the first and second axis.

2. The device according to claim 1 wherein the cameras are horizontally and parallelly disposed.

3. A camera adjusting device for an electronic device on a printed circuit board comprising:

first and second cameras mounted on a base member, wherein said first and second cameras are aligned along first and second axes, respectively, and wherein said first and second axes are parallel and at a fixed distance from one another;

first and second mirrors fixedly disposed on a base panel, wherein said first and second mirrors are inclined in a direction opposite the other;

a third mirror attached to the base panel, wherein light parallel to a vertical axis Y from a first viewing area is reflected parallel to an axis Y' by said first mirror to said third mirror, and wherein said light is further reflected by said third mirror to said first camera parallel to an axis X';

a fourth mirror attached to the base panel, wherein light parallel to the vertical axis Y from a second viewing area is reflected parallel to an axis Y' by said second mirror to said fourth mirror, and wherein said light is further reflected by said fourth mirror to said second camera parallel to the axis X';

means for moving said base member with respect to said base panel in a vertical direction parallel to the vertical axis Y and in a horizontal direction parallel to a horizontal axis X, wherein the horizontal axis X and the axis Y' are perpendicular to the axis X'.

4. A camera adjusting device for an electronic device on a printed circuit board according to claim 3, wherein moving said base member in a vertical direction parallel to the axis Y moves the first and second viewing areas in a direction parallel to the axis Y'.

5. A camera adjusting device for an electronic device on a printed circuit board according to claim 3, wherein moving said base member in a horizontal direction parallel to the axis X moves the first and second viewing areas in a direction parallel to the axis X'.

* * * * *